(12) United States Patent
Lee et al.

(10) Patent No.: US 10,950,757 B2
(45) Date of Patent: Mar. 16, 2021

(54) FLIP CHIP TYPE LIGHT EMITTING DIODE CHIP

(71) Applicant: SEOUL VIOSYS CO., LTD., Gyeonggi-do (KR)

(72) Inventors: Jin Woong Lee, Gyeonggi-do (KR); Kyoung Wan Kim, Gyeonggi-do (KR); Tae Jun Park, Gyeonggi-do (KR); Sang Won Woo, Gyeonggi-do (KR)

(73) Assignee: SEOUL VIOSYS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/549,556

(22) Filed: Aug. 23, 2019

(65) Prior Publication Data

US 2020/0127167 A1    Apr. 23, 2020

(30) Foreign Application Priority Data

Oct. 23, 2018    (KR) .................. 10-2018-0126912

(51) Int. Cl.
*H01L 33/40*    (2010.01)
*H01L 51/10*    (2006.01)
*H01S 5/125*    (2006.01)

(52) U.S. Cl.
CPC .......... *H01L 33/405* (2013.01); *H01L 51/105* (2013.01); *H01S 5/125* (2013.01)

(58) Field of Classification Search
CPC ......... H01L 33/06; H01L 33/22; H01L 33/24; H01L 33/38; H01L 33/40; H01L 33/405; H01L 33/42; H01L 33/46; H01L 33/62; H01L 52/10; H01L 52/105

USPC .......................................................... 257/98
See application file for complete search history.

(56) References Cited

U.S. PATENT DOCUMENTS 9,851,056 B2    12/2017    Kim et al.
2020/0006612 A1 *    1/2020    Lee .................. H01L 33/24

FOREIGN PATENT DOCUMENTS

KR        101206253 B1    11/2012

OTHER PUBLICATIONS

Taiwanese Office Action for Application No. 10920033220 dated Jan. 14, 2019 and relevant English translation (8 pages).

* cited by examiner

*Primary Examiner* — Fazli Erdem
(74) *Attorney, Agent, or Firm* — Burris Law, PLLC

(57) ABSTRACT

A flip chip type light emitting diode chip is disclosed. The light emitting diode chip includes a substrate; a first conductivity type semiconductor layer disposed on the substrate; a mesa disposed on a partial region of the first conductivity type semiconductor layer, and including an active layer and a second conductivity type semiconductor layer; a transparent electrode; a contact electrode laterally spaced apart from the mesa; a current spreader electrically connected to the transparent electrode; a first insulating reflection layer covering the substrate; and a second insulating reflection layer disposed under the substrate, and including the distributed Bragg reflector.

20 Claims, 6 Drawing Sheets

FLIP CHIP TYPE LIGHT EMITTING DIODE CHIP

CROSS-REFERENCE TO RELATED APPLICATIONS

This application claims priority to and the benefit of Korean Patent Application No. 10-2018-0126912, filed on Oct. 23, 2018, which is hereby incorporated in its entirety by reference for all purposes as set forth herein.

TECHNICAL FIELD

Exemplary embodiments of the present disclosure relate to a flip chip type light emitting diode chip.

RELATED ART

Light emitting diodes are used in various products such as back light units (BLUs), general lighting, electric products, small home appliances, and interior products. Light emitting diodes can be used not only as a light source, but also for various purposes including conveying of information, aesthetic applications, and the like.

Meanwhile, flip chip type light emitting diodes are generally fabricated to provide high efficiency light emitting diodes. The flip chip type light emitting diodes have excellent heat dissipation performance and may improve the light extraction efficiency by using reflective layers. Further, since a flip bonding technique is used, bonding wires can be omitted, and the stability of the light emitting device is improved.

However, light may be emitted upward with a straight line when the flip chip type light emitting diodes are used in the backlight units. As a result, a spot phenomenon may occur on a display surface. To prevent this problem, a technique of spreading light by disposing a diffusion plate, a filter, or the like on the light emitting diode is used, but an optical loss may not be avoided.

Conventionally, the flip chip type light emitting diode generally uses a metal reflection layer to reflect light. Since the metal reflection layer has both an ohmic characteristic and a reflection characteristic at the same time, both light reflection and electrical connection may be achieved. However, the reflectivity of the metal reflection layer is not relatively high, thereby resulting in significant loss of light. Moreover, in case the light emitting diode may be used for an extended period of time, the reflectivity of the metal reflection layer may decrease.

Therefore, there is a need for a flip chip type light emitting diode capable of reducing light loss due to the use of the metal reflection layer.

SUMMARY

Exemplary embodiments of the present disclosure provide a flip chip type light emitting diode chip capable of spreading light in a wide area without using a diffusion plate or a filter. Exemplary embodiments of the present disclosure provide a flip chip type light emitting diode chip capable of reducing light loss due to a metal reflection layer and improving luminous efficacy. Exemplary embodiments of the present disclosure provide a flip chip type light emitting diode chip having a different viewing angle depending on a direction. Exemplary embodiments of the present disclosure provide a compact light emitting diode chip that is structurally simple.

In accordance with one aspect of the present disclosure, a flip chip type light emitting diode chip comprises: a substrate; a first conductivity type semiconductor layer disposed on the substrate; a mesa; a contact electrode; a current spreader; a transparent electrode; and a second insulating reflection layer. The mesa is disposed on a partial region of the first conductivity type semiconductor layer, and including an active layer and a second conductivity type semiconductor layer. The transparent electrode is in ohmic contact with the second conductivity type semiconductor layer. The contact electrode is laterally spaced apart from the mesa and disposed on the first conductivity type semiconductor layer and in ohmic contact with the first conductivity type semiconductor layer. The current spreader is disposed on a partial region of the transparent electrode and electrically connected to the transparent electrode. The first insulating reflection layer covers the substrate, the first conductivity type semiconductor layer, the mesa, the transparent electrode, the contact electrode and the current spreader, and has openings exposing portions of the contact electrode and the current spreader. The first insulating reflection layer includes a distributed Bragg reflector; a first pad electrode and a second pad electrode disposed on the first insulating reflection layer, and connected to the contact electrode and the current spreader through the openings, respectively. The second insulating reflection layer is disposed under the substrate, and including the distributed Bragg reflector. The second insulating reflection layer is spaced apart from the first insulating reflection layer.

In accordance with aspects of the present disclosure, a light emitting diode chip includes a first insulating reflection layer and a second insulating reflection layer, and thus it is possible to provide the light emitting diode chip emitting light to a side surface thereof. Further, light traveling toward a side of a pad electrode may be reflected by using a first insulating reflection layer, and thus light loss caused by metal layers may be reduced. In addition, contact electrodes, current spreaders, and pad electrodes are formed separately, and thus it is possible to provide a flip chip type light emitting diode chip which is structurally simple and improves reliability.

The foregoing general description and the following detailed description are exemplary and explanatory, and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE EMBODIMENTS

Figure 1:
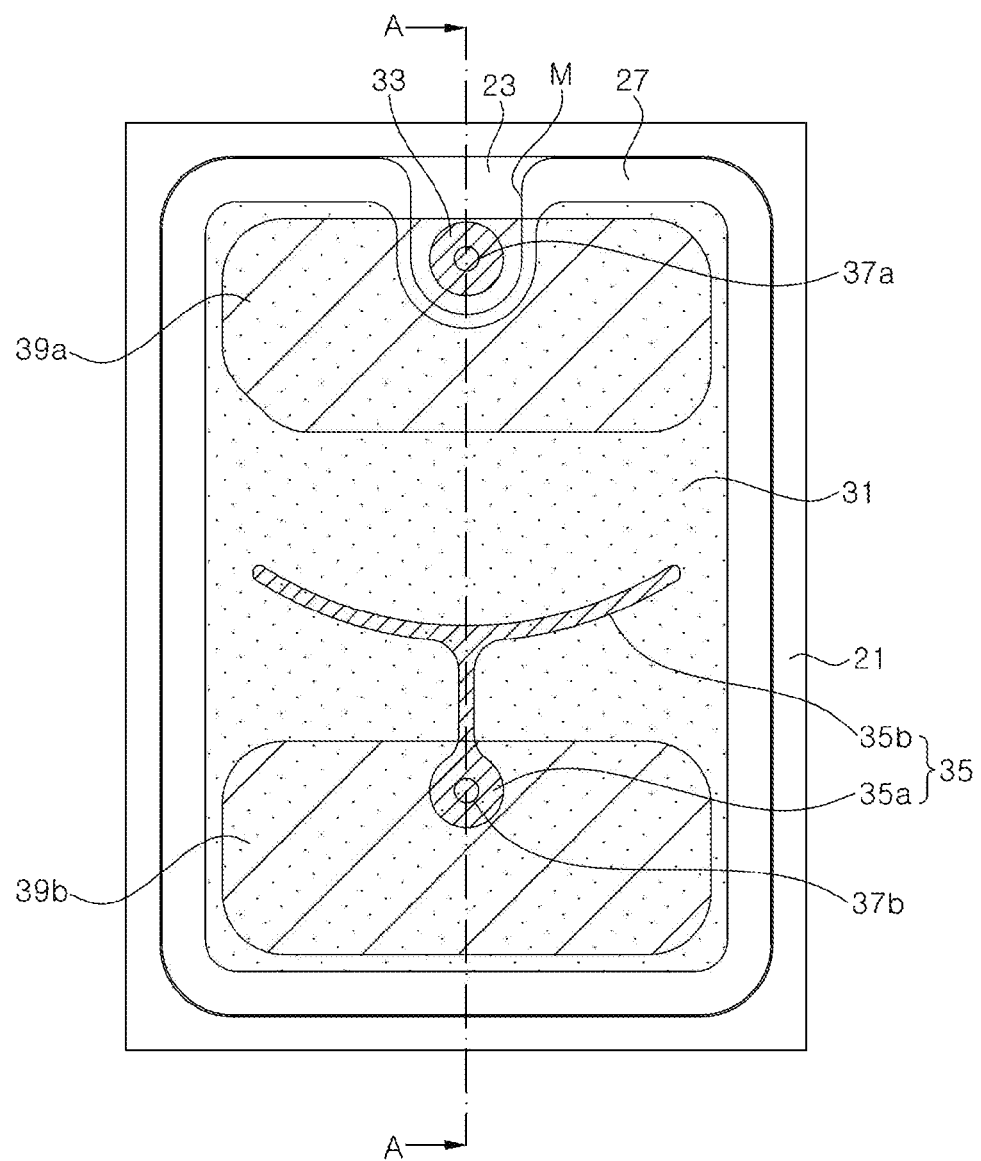
FIG. 1 is a schematic plan view illustrating a light emitting diode chip according to an exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can also be present. Throughout the specification, like reference numerals denote like elements having the same or similar functions.

Exemplary embodiments of the present disclosure provide a flip chip type light emitting diode chip comprising: a substrate; a first conductivity type semiconductor layer disposed on the substrate; a mesa disposed on a partial region of the first conductivity type semiconductor layer, and including an active layer and a second conductivity type semiconductor layer; a transparent electrode being in ohmic contact with the second conductivity type semiconductor layer; a contact electrode laterally spaced apart from the mesa and disposed on the first conductivity type semiconductor layer, the contact electrode being in ohmic contact with the first conductivity type semiconductor layer; a current spreader disposed on a partial region of the transparent electrode and electrically connected to the transparent electrode; a first insulating reflection layer covering the substrate, the first conductivity type semiconductor layer, the mesa, the transparent electrode, the contact electrode and the current spreader, having openings exposing portions of the contact electrode and the current spreader, and including a distributed Bragg reflector; a first pad electrode and a second pad electrode disposed on the first insulating reflection layer, and connected to the contact electrode and the current spreader through the openings, respectively; and a second insulating reflection layer disposed under the substrate, and including the distributed Bragg reflector, wherein the second insulating reflection layer is spaced apart from the first insulating reflection layer.

The contact electrode and the current spreader may have the same layer structure. For example, the contact electrode and the current spreader may include an ohmic layer for forming an ohmic contact with the first conductivity type semiconductor layer [cykim1]. In addition, the contact electrode and the current spreader may include an anti-diffusion layer, and thus diffusion of metal atoms from the pad electrodes may be prevented.

The current spreader may include a connection pad and an extension extending from the connection pad, the opening of the first insulating reflection layer may be located on the connection pad, and the second pad electrode may be connected to the connection pad through the opening.

Further, the current spreader has an area not more than 1/10 of an area of the transparent electrode. A region of the transparent electrode not covered with the current spreader is covered with the first insulating reflection layer, and thus light loss due to the current spreader may be reduced.

Thicknesses of the contact electrode and the current spreader may be greater than that of the mesa.

Moreover, a lateral distance between the contact electrode and the mesa may be greater than a thickness of the insulating reflection layer. Therefore, a defect such as breakage of the first insulating reflection layer may be prevented.

In one exemplary embodiment, the first insulating reflection layer and the second insulating reflection layer may include a short wavelength DBR (distributed Bragg reflector) and a long wavelength DBR, respectively, and the long wavelength DBR of the first insulating reflection layer and the long wavelength DBR of the second insulating reflection layer may be disposed closer to the substrate than the short wavelength DBR of the first insulating reflection layer and the short wavelength DBR of the second insulating reflection layer, respectively.

In another exemplary embodiment, the first insulating reflection layer and the second insulating reflection layer may include a short wavelength DBR and a long wavelength DBR, respectively, and the short wavelength DBR of the first insulating reflection layer and the short wavelength DBR of the second insulating reflection layer may be disposed closer to the substrate than the long wavelength DBR of the first insulating reflection layer and the long wavelength DBR of the second insulating reflection layer, respectively.

The short wavelength DBRs and the long wavelength DBRs of the first insulating reflection layer and the second insulating reflection layer are disposed symmetrically with the substrate interposed therebetween, and thus light extraction efficiency through a side surface of the substrate may be improved.

The substrate may have a rectangular shape having a major axis and a minor axis, and the light emitting structure may have a rectangular shape having a major axis and a minor axis on the substrate. The second insulating reflection layer is disposed on a lower surface of the substrate, the substrate and the light emitting structure are formed to have long rectangular shapes, and thus it is possible to provide a flip chip type light emitting diode chip having a different viewing angle depending on a direction thereof.

Further, an upper surface of the substrate may be exposed around the light emitting structure, and a total width of the upper surface of the substrate exposed around the light emitting structure along the major axis direction or the minor axis direction may be within a range of 1/10 to 1/6 of a length of the substrate in the major axis direction or the minor axis direction. The width of the exposed upper surface of the substrate is adjusted, and thus an amount of light emitted to the side surface of the substrate may be controlled.

Moreover, a viewing angle of light measured along the major axis direction and a viewing angle of light measured along the minor axis direction may differ by 5 degrees or more.

The first insulating reflection layer may cover all of the exposed upper surfaces of the substrate. Therefore, light emission through the upper surfaces of the substrate may be prevented.

A side surface of the first insulating reflection layer may be in flush with the side surface of the substrate. In addition, a side surface of the second insulating reflection layer may be in flush with the side surface of the substrate. Therefore, only the side surface of the substrate is used as a light extracting surface, and unnecessary light leakage is prevented, thereby improving the luminous efficacy.

Meanwhile, the substrate may include a roughened surface on the side surface thereof. The roughened surface may be formed along a periphery of the substrate.

The openings of the first insulating reflection layer may be limitedly disposed on partial regions of the contact electrode and the current spreader, respectively. The substrate is a patterned sapphire substrate. Meanwhile, at least one of the side surfaces of the substrate may be inclined with respect to the lower surface of the substrate.

Hereinafter, exemplary embodiments of the present disclosure will be described in detail with reference to the accompanying drawings.

Figure 2:
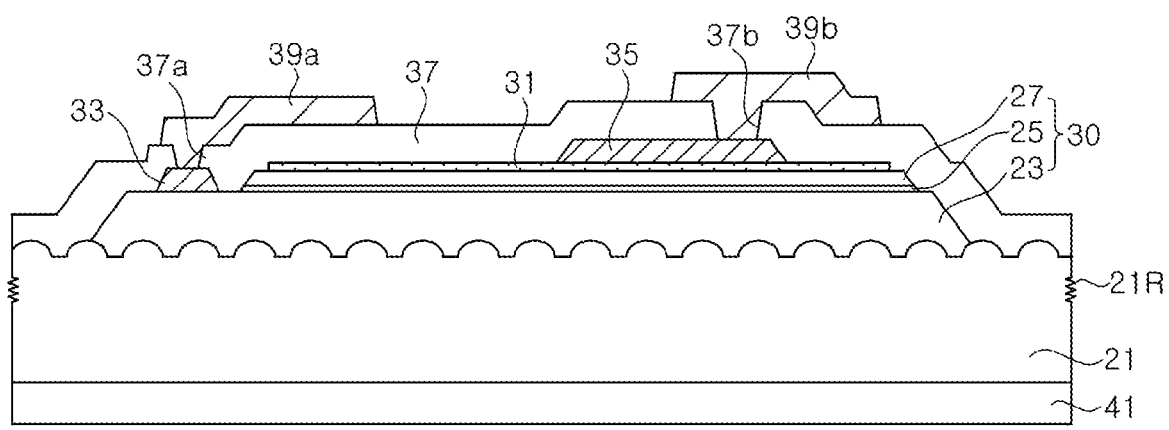
FIG. 2 is a cross-sectional view taken along line A-A in FIG. 1.
Figure 3:
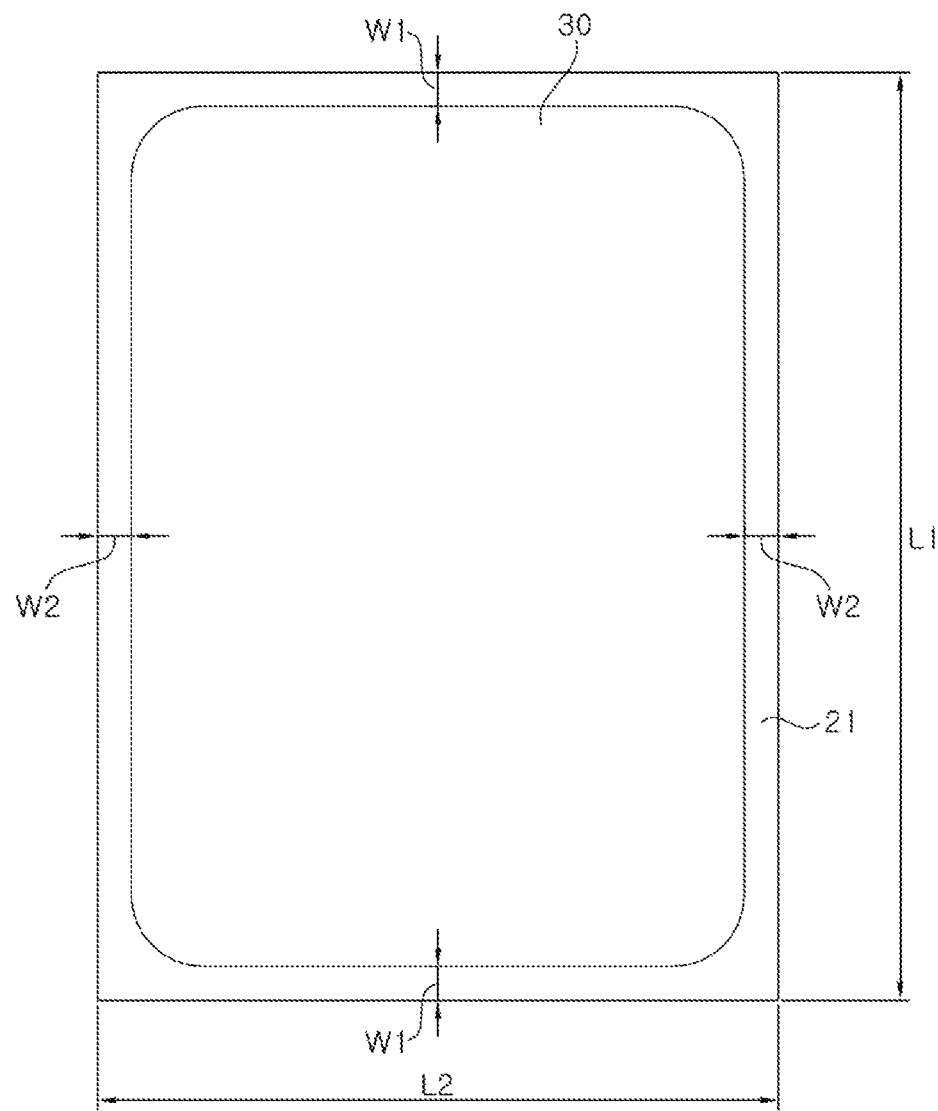
FIG. 3 is a schematic plan view illustrating an exposed upper surface of the substrate of FIG. 1.

FIG. 1 is a schematic plan view illustrating a light emitting diode chip according to an exemplary embodiment of the present disclosure, FIG. 2 is a cross-sectional view taken along line A-A in FIG. 1, and FIG. 3 is a schematic plan view illustrating an exposed upper surface of the substrate of FIG. 1.

Referring to FIGS. 1 and 2, the light emitting diode chip according to the present embodiment includes a substrate 21, a light emitting structure 30, a transparent electrode 31, a contact electrode 33, a current spreader 35, a first insulating reflection layer 37, a second insulating reflection layer 41, a first pad electrode 39a, and a second pad electrode 39b.

As shown in FIG. 1, the light emitting diode chip may have a long rectangular shape having a major axis and a minor axis, and may be a compact light emitting diode chip having a relatively small horizontal cross sectional area. A length of the light emitting diode chip in the longitudinal direction does not exceed twice of a length in the lateral direction. For example, the length of the light emitting diode chip in the longitudinal direction may be 300 μm and the length thereof in the lateral direction may be 220 μm by way of example. In addition, an overall thickness of the light emitting diode chip may be within a range of about 100 μm to 200 μm by way of example. Other dimensions are possible.

The substrate 21 may be an insulating substrate, or alternatively, a conductive substrate. The substrate 21 may be a growth substrate for growth of the light emitting structure 30, and may include a sapphire substrate, a silicon carbide (SiC) substrate, a silicon (Si) substrate, a gallium nitride (GaN) substrate, an aluminum nitride (AlN) substrate, or other substrates. As shown in the drawings, the substrate 21 may include a plurality of protrusions disposed on at least a partial region of the upper surface thereof. On the substrate 21, the plurality of protrusions may be disposed in a regular, or irregular pattern. For example, the substrate 21 may include a patterned sapphire substrate (PSS) having a plurality of protrusions disposed on an upper surface thereof. The substrate 21 may have a thickness within a range of about 100 to 200 μm by way of example.

As shown in FIG. 2, the substrate 21 may also include a roughened surface 21R on a side surface thereof. The roughened surface 21R may be disposed closer to the light emitting structure 30 than a lower surface of the substrate 21, and may be formed on the entire side surface along a periphery of the substrate 21. The roughened surface 21R may be formed by using a stealth laser when dicing the substrate 21, and improves the extraction efficiency of light through the side surface of the substrate 21.

The light emitting structure 30 is located on the substrate 21. The light emitting structure 30 may have a rectangular shape having a major axis and a minor axis, similar to the substrate 21. In addition, an area of a lower surface of the light emitting structure 30 is smaller than that of the upper surface of the substrate 21, and the upper surface of the substrate 21 may be exposed around the light emitting structure 30. A portion of the plurality of protrusions on the upper surface of the substrate 21 are interposed between the light emitting structure 30 and the substrate 21, and the plurality of protrusions not covered by the light emitting structure 30 are exposed around the light emitting structure 30.

The upper surface of the substrate 21 is exposed to an isolation region around the light emitting structure 30, and thus bowing in a manufacturing process of the light emitting diode chip may be reduced. Accordingly, damage to the light emitting structure 30 due to the bowing may be prevented, and a production yield of the light emitting diode chip may be improved. In addition, the bowing may be reduced, thus, stress applied to the light emitting structure 30 may be reduced, and the thickness of the substrate 21 may be further reduced. Therefore, a slimed light emitting diode chip having a thin thickness of approximately 100 μm may be provided.

The upper surface of the substrate 21 as shown in FIG. 3 are exposed around the light emitting structure 30. A portion of the upper surface of the substrate having the same width may be exposed on both sides of the light emitting structure 30, but the present disclosure is not limited thereto. A width of the upper surface of the substrate exposed in one direction may be within a range of 6:1 to 10:1 with respect to a length of the substrate 21 in the one direction. That is, a ratio of a width of 2×W1 of the substrate 21 exposed in the longitudinal direction with respect to a longitudinal length L1 of the substrate 21 may be about 1/10 to about 1/6, and a ratio of a width 2×W2 of the substrate 21 exposed in the lateral direction with respect to a lateral length L2 thereof may also be about 1/10 to about 1/6.

The light emitting structure 30 includes a first conductivity type semiconductor layer 23, a second conductivity type semiconductor layer 27 disposed on the first conductivity type semiconductor layer 23, and an active layer 25 interposed between the first conductivity type semiconductor layer 23 and the second conductivity type semiconductor layer 27, as shown in FIG. 2. The light emitting structure 30 may have an overall thickness of about 5 to 10 μm by way of example. Other dimensions are possible.

The first conductivity type semiconductor layer 23, the active layer 25 and the second conductivity type semiconductor layer 27 may include a III-V nitride-based semiconductor, for example, a nitride-based semiconductor such as (Al, Ga, In)N. The first conductivity type semiconductor layer 23 may include an n-type impurity (for example, Si, Ge, Sn) and the second conductivity type semiconductor layer 27 may include a p-type impurity (for example, Mg, Sr, Ba), or vice versa. The active layer 25 may include a multi-quantum well (MQW) structure and the composition ratio of the nitride-based semiconductors may be adjusted to emit light having a desired wavelength. Particularly, in this exemplary embodiment, the second conductivity type semiconductor layer 27 may be a p-type semiconductor layer.

The first conductivity type semiconductor layer 23 may have an inclined side surface. Further, an inclination angle of the inclined side surface may be about 45 degrees or less with respect to a bottom surface of the substrate 21. In a structure where the side surface of the first conductivity type semiconductor layer 23 has a gentle inclination, the light emitting diode chip may prevent the first insulating reflection layer 37 covering the light emitting structure 30 and the substrate 21 from suffering defects such as cracks.

The light emitting structure 30 includes a mesa M. The mesa M may be disposed in a partial region of the first conductivity type semiconductor layer 23 and includes the active layer 25 and the second conductivity type semiconductor layer 27. The mesa M may have a thickness of about 1 to 2 μm by way of example. In this structure, the first conductivity type semiconductor layer 23 may be partially exposed around the mesa M. In some regions, an inclined surface of the mesa M is flush with the inclined surface of the first conductivity type semiconductor layer 23, and thus an exposed surface of the upper surface of the first conductivity type semiconductor layer 23 may be limited to one side of the mesa M. However, the present embodiment is not limited thereto, but the upper surface of the first conductivity type semiconductor layer 23 may be exposed around the mesa M. In another embodiment, a through hole or a through-groove may be formed in the mesa M to expose the first conductivity type semiconductor layer 23.

The mesa M may have a rectangular shape in which a portion of the mesa M is removed to expose the first conductivity type semiconductor layer 23. In addition, the mesa M may have an inclined side surface, and an inclination angle of the inclined side surface may be about 45 degrees or less with respect to the bottom surface of the substrate 21. Furthermore, in a case that the side surface the first conductivity type semiconductor layer 23 is flush with that of the mesa M, the first conductivity type semiconductor layer 23 and the mesa M may form the same inclined surface.

The light emitting structure 30 may be formed by growing sequentially the first conductivity type semiconductor layer 23, the active layer 25 and the second conductivity type semiconductor layer 27 on the substrate 21, forming a mesa M through a mesa etching process, and then patterning the first conductivity type semiconductor layer 27 to expose the substrate 21.

The transparent electrode 31 is disposed on the second conductivity type semiconductor layer 27. The transparent electrode 31 may be in ohmic contact with the second conductivity type semiconductor layer 27. The transparent electrode may include, for example, an optically transparent conductive oxide layer such as indium tin oxide (ITO), zinc oxide (ZnO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), and fluorine tin oxide (FTO). The conductive oxides may further include various dopants.

The transparent electrode 31 including an optically transparent conductive oxide has an excellent ohmic characteristic with the second conductivity type semiconductor layer 27. That is, since contact resistance between a conductive oxide such as ITO or ZnO and the second conductivity type semiconductor layer 27 is lower than that between a metallic electrode and the second conductivity type semiconductor layer 27, it is possible to reduce forward voltage Vf of the light emitting diode chip by applying the transparent electrode 31 including the conductive oxide, thereby improving luminous efficacy.

Particularly, in a case of a compact light emitting diode chip for use in the present embodiment, the light emitting diode chip is greatly influenced by the ohmic characteristic because of a relatively low current density thereof. Accordingly, in a structure where the transparent electrode 31 is used, and thus the ohmic characteristic is improved, it is possible to more effectively improve the luminous efficacy. In addition, the conductive oxide has a lower probability of peeling off of the nitride-based semiconductor layer than the metallic electrode, and is stable even after long use. Therefore, it is possible to improve reliability of the light emitting diode chip by using the transparent electrode 31 including the conductive oxide.

The transparent electrode 31 may have a thickness of about 400 Å to 3,000 Å, without being limited thereto. If the thickness of the transparent electrode 31 is excessively large, light passing through the transparent electrode 31 may be absorbed, and thus a loss may occur. Therefore, the thickness of the transparent electrode 31 is configured to be 3000 Å or less.

The transparent electrode 31 may be disposed to substantially cover an entire upper surface of the second conductivity type semiconductor layer 27, thereby improving current spreading efficiency upon operation of the light emitting diode chip. For example, the side surfaces of the transparent electrode 31 may be disposed along the side surfaces of the mesa M.

The transparent electrode 31 may be formed on the second conductivity type semiconductor layer 27 after the light emitting structure 30 is formed, or alternatively, may be formed on the second conductivity type semiconductor layer 27 before mesa etching.

The contact electrode 33 is disposed on the first conductivity type semiconductor layer 23 near the mesa M. The contact electrode 33 is in ohmic contact with the first conductivity type semiconductor layer 23. For this purpose, the contact electrode 33 includes a metal layer being in ohmic contact with the first conductivity type semiconductor layer 33.

The contact electrode 33 does not overlap with the active layer 25 or the second conductivity type semiconductor layer 27 of the mesa M, and thus an insulation layer insulating the contact electrode 33 from the second conductivity type semiconductor layer 27 is omitted. Therefore, the contact electrode 33 may be formed, for example, by using a lift-off process on the light emitting structure 30 on which the transparent electrode 31 is formed. At this time, the current spreader 35 described below may also be formed.

Meanwhile, the contact electrode 33 is spaced apart from the mesa M at a sufficient distance, and the distance may be larger than a thickness of the first insulating reflection layer 37. However, when the distance of the contact electrode 33 is excessively large, an emission area decreases, so that the distance may be smaller than a diameter of the contact electrode 33. The contact electrode 33 may also function as a connection pad of the first pad electrode 39a, which will be described below.

The current spreader 35 is disposed on the transparent electrode 31 and is electrically connected to the transparent electrode 31 to help spread the current in the second conductivity type semiconductor layer 27. The conductive oxide may have a relatively low current spreading capability in the lateral direction as compared with the metallic electrode, but the current spreading capability may be enhanced by using the current spreader 35. Furthermore, the thickness of the transparent electrode 31 may be reduced by including the current spreader 35.

Meanwhile, to reduce the light absorption by the current spreader 35, the current spreader 35 is limitedly disposed on a partial region of the transparent electrode 31. A total area of the current spreader 35 does not exceed 1/10 of an area of the transparent electrode 31. The current spreader 35 may include a connection pad 35a and an extension 35b extending from the connection pad 35a. The connection pad 35a has a larger width than the extension 35b, and the extension 35b is interposed between the connection pad 35a and the contact electrode 33. The extension 35b may have various shapes for current spreading. For example, the extension 35b may include a portion extending from the connection pad 35a toward the contact electrode 33 and a portion extending in the lateral direction from the portion extending from the connection pad 35a toward the contact electrode 33.

In some embodiments, the contact electrode 33 and the current spreaders 35 may be formed substantially at the same time using the same material in the same process, and thus may have the same layer structure with each other. In other embodiments, a different process, a different timing, different materials, or a combination thereof may be used. For example, the contact electrode 33 and the current spreaders 35 may include an Al reflective layer and may include an Au connection layer. Specifically, the contact electrode 33 and the current spreaders 35 may have a layered structure of Cr/Al/Ti/Ni/Ti/Ni/Au/Ti. Thicknesses of the contact electrode 33 and the current spreaders 35 may be greater than a thickness of the mesa M, and thus an upper surface the contact electrode 33 may be positioned higher than an upper surface of the mesa M. For example, the thickness of the mesa M may be approximately 1.5 μm, and the thicknesses of the contact electrode 33 and the current spreaders 35 may be approximately 2 μm by way of example.

The first insulating reflection layer 37 covers the substrate 21, the first conductivity type semiconductor layer 23, the mesa M, the transparent electrode 31, and the contact electrode 33 and the current spreaders 3. The first insulating reflection layer 37 covers an upper region and the side surfaces of the mesa M, and also covers the first conductivity type semiconductor layer 23 and side surfaces of the first conductivity type semiconductor layer 23 exposed around the mesa M. The first insulating reflection layer 37 further covers the upper surface of the substrate 21 exposed around the first conductivity type semiconductor layer 23. The first insulating reflection layer 37 also covers a region between the contact electrode 33 and the mesa M.

Meanwhile, the first insulating reflection layer 37 has openings 37a and 37b for exposing the contact electrode 33 and the connection pad 35a. The openings 37a and 37b are smaller than an area of the contact electrode 33 and the contact pad 35a, respectively, and are limitedly disposed on the contact electrode 33 and the contact pad 35a.

The first insulating reflection layer 37 includes a distributed Bragg reflector. The distributed Bragg reflector may be formed by repeatedly stacking dielectric layers having different indices of refraction and including, for example, $TiO_2$, $SiO_2$, $HfO_2$, $ZrO_2$, $Nb_2O_5$, $MgF_2$, or others. For example, the first insulating reflection layer 37 may have an alternating structure of $TiO_2/SiO_2$ layers. The distributed Bragg reflector is fabricated to reflect light generated in the active layer 25 and is formed of a plurality of pairs of layers to improve the reflectivity. In this embodiment, the distributed Bragg reflector may comprise 10 to 25 pairs of layers. The first insulating reflection layer 37 may include additional insulating reflection layers with the distributed Bragg reflector, for example, an interface layer positioned below the distributed Bragg reflector and a protective layer covering the distributed Bragg reflector to improve the adhesion of the distributed Bragg reflector and a lower layer thereof. The interface layer may be formed of, for example, a $SiO_2$ layer, and the protective layer may be formed of $SiO_2$ or $SiN_X$.

The first insulating reflection layer 37 may have a thickness of about 2 μm to 5 μm. The distributed Bragg reflector may have a reflectivity of 90% or higher with respect to light generated in the active layer 25, and the distributed Bragg reflector having a reflectivity near 100% may be provided by controlling the kinds, thicknesses and stacking periods of the dielectric layers constituting the distributed Bragg reflector. Furthermore, the distributed Bragg reflector may also have a high reflectivity with respect to visible light other than the light generated in the active layer 25.

For example, the first insulating reflection layer 37 may include a single-wavelength DBR suitable for reflecting visible light of a short wavelength (for example, 400 nm) generated in the active layer 25 and a long wavelength DBR suitable for reflecting visible light of a long wavelength (for example, 700 nm) converted by a wavelength converter such as a phosphor. A reflection band may be widened by using the long wavelength DBR and the short wavelength DBR, and furthermore, light with an inclination angle incident on the first insulating reflection layer 37 may be reflected with a high reflectivity. In this embodiment, the long wavelength DBR may be disposed closer to the light emitting structure 30 than the short wavelength DBR, or vice versa.

More specifically, the DBR structure of the first insulating reflection layer 37 may be distinctly divided into a first region, a second region, and a third region, where the first region is disposed closer to the light emitting structure 30 than the second region, and the third region is interposed between the first region and the second region.

(First Region)

The first region is provided to increase reflectivity near the central wavelength ($\lambda$) and in a spectrum region having a longer wavelength (for example, 700 nm) than the central wavelength ($\lambda$). Accordingly, the first material layers and the second material layers in the first region generally have an optical thickness near $0.25\lambda$, or greater than $0.25\lambda$.

Specifically, in the first region, the first material layers ($SiO_2$ layers) are divided into a first group of first material layers having an optical thickness greater than $0.25\lambda+10\%$ and a second group of first material layers having an optical thickness greater than $0.25\lambda-10\%$ and smaller than $0.25\lambda+10\%$. The first group of first material layers and the second group of first material layers are alternately arranged. In this embodiment, the first group of first material layers having a relatively large thickness and the second group of first material layers having a relatively small thickness are alternately arranged. The first group of first material layers may be formed prior to the second group of first material layers, or vice versa.

Furthermore, the first group of first material layers generally has an optical thickness smaller than $0.3\lambda+10\%$.

Meanwhile, the second material layers in the first region (for example, $TiO_2$ layers) include a first group of second material layers having an optical thickness greater than $0.25\lambda+10\%$ and a second group of second material layers having an optical thickness greater than $0.25\lambda-10\%$ and smaller than $0.25\lambda+10\%$.

The optical thickness of the first group of second material layers is clearly distinguished from the optical thickness of the second group of second material layers. In addition, most of the first group of second material layers and the second group of second material layers are alternately disposed one another.

Meanwhile, the first group of second material layers generally has a smaller optical thickness than that of the first group of first material layers. Further, the first group of second material layers has a smaller average optical thickness than that of the first group of first material layers. The second material layers having a relatively higher index of refraction exhibit higher light absorption rate than that of the first material layers having a relatively lower index of refraction, and thus the first group of second material layers may be formed to have a relatively small thickness, thereby reducing light loss.

The first group of second material layers may have an optical thickness smaller than $0.25\lambda+20\%$ (that is, $0.3\lambda$). Conversely, the first group of first material layers generally has an optical thickness greater than $0.25\lambda+20\%$.

Meanwhile, although the second group of second material layers may also have a smaller optical thickness than that of the second group of first material layers so as to reduce light loss, since the second group of second material layers has a relatively smaller optical thickness than that of the first group of second material layers, reduction in thickness of the second group of second material layers does not provide a substantial effect in reduction of light loss. Therefore, the second group of second material layers and the second group of first material layers may generally have a similar optical thickness.

(Second Region)

The second region is provided to increase reflectivity in a spectrum region having a shorter wavelength than the central wavelength ($\lambda$). Accordingly, the first material layers and the second material layers in the second region generally have an optical thickness smaller than $0.25\lambda$.

Specifically, the second region includes a third group of first material layers having an optical thickness smaller than $0.25\lambda-10\%$ and consecutively arranged. Furthermore, the third group of first material layers has an optical thickness greater than $0.2\lambda-10\%$.

As shown in the drawings, it can be clearly seen that an optical thickness deviation of the first material layers in the second region is smaller than the optical thickness deviation of the first material layers in the first region. The first group of first material layers and the second group of first material layers in the first region have clearly different optical thicknesses, and thus the first material layers in the first region have a higher optical thickness deviation than that of the first material layers in the second region which generally have a similar optical thickness.

Meanwhile, the second material layers in the second region include a third group of second material layers having an optical thickness smaller than $0.25\lambda-10\%$ and consecutively arranged. In the second region, only the first second material layer (that is, the second material layer in the thirteenth pair) has an optical thickness greater than $0.25\lambda-10\%$ and all of other second material layers have optical thicknesses smaller than $0.25\lambda-10\%$.

(Third Region)

The third region is interposed between the first region and the second region so as to remove ripples generated upon stacking DBRs having different reflection bands. The third region is generally composed of a small number of pairs. The first region is composed of the largest number of pairs, and the third region is composed of the smallest number of pairs in the present embodiment. Specifically, the third region includes a first material layer having an optical thickness smaller than $0.25\lambda-10\%$, and a first material layer having an optical thickness greater than $0.25\lambda$. Further, the third region may include a first material layer having an optical thickness greater than $0.25\lambda-10\%$ and smaller than $0.25\lambda$.

In addition, the second material layers in the third region include a second material layer having an optical thickness smaller than $0.25\lambda-10\%$, and a second material layer having an optical thickness greater than $0.25\lambda$, and smaller than $0.25\lambda+10\%$. Furthermore, the second material layers in the third region may further include a second material layer having an optical thickness greater than $0.25\lambda+10\%$.

In the third layer composed of a relatively small number of pairs, the first material layers and the second material layers have more various optical thicknesses than those of the material layers in the first region and in the second region.

According to the present embodiment, the first and second material layers in the first region disposed relatively close to the light emitting structure 30 and reflecting light in a long wavelength range are divided into the first group having a relatively higher optical thickness and the second group having a relatively smaller optical thickness, thereby enabling removal of ripples generated in the stop band as the incident angle increases. It is advantageous that the number of pairs in the first region is greater than the number of pairs in the other regions to reinforce a reflectivity of the long wavelength range.

Meanwhile, the first pad electrode 39a and the second pad electrode 39b are disposed on the first insulating reflection layer 37, and are electrically connected to the contact electrode 33 and the connection pads 35a through the openings 37a and 37b, respectively. As shown in FIG. 1, the first pad electrode 39a is generally disposed in an upper region of the transparent electrode 31, and a portion of the first pad electrode 39a is disposed on the contact electrode 33. In addition, the first pad electrode 39a is spaced apart from the current spreader 35 in the lateral direction so as not to overlap with the current spreader 35. Since the first pad electrode 39a does not overlap with the current spreader 35 even when a crack is generated in the first insulating reflection layer 37, occurrence of an electrical short circuit between the first pad electrode 39a and the current spreader 35 may be prevented.

The second pad electrode 39b is disposed in the upper region of the transparent electrode 31 and is connected to the connection pad 35a of the current spreader 35 through the opening 37b. As shown in the drawing, the second pad electrode 39b may overlap with the connection pad 35a of the current spreader 35, and may further overlap with a portion of the extension 35b. Meanwhile, the second pad electrode 39b is spaced apart from the contact electrode 33 in the lateral direction so as not to overlap with the contact electrode 33. In particular, the second pad electrode 39b is disposed within an upper region of the mesa M, and does not extend toward a region between the mesa M and the contact electrode 33.

The first pad electrode 39a and the second pad electrode are spaced apart from each other in a predetermined distance on the mesa M. A shortest distance between the first pad electrode 39a and the second pad electrode 39b may be, for example, about 3 μm to about 100 μm by way of example. The first pad electrode 39a and the second pad electrode 39b may be formed at substantially at the same time using the same material in the same process, and thus may have the same layer structure with each other. In other embodiments, a different process, a different timing, different materials, or a combination thereof may be used. Thicknesses of the first and second pad electrodes 39a and 39b may be smaller than that of the first insulating reflection layer 37, and may be, for example, about 2 μm by way of example.

The second insulating reflection layer 41 is disposed under the substrate 21. The second insulating reflection layer 41 may cover an entire lower surface of the substrate 21. The second insulating reflection layer 41 includes a distributed Bragg reflector. The second insulating reflection layer 41 may further include an interface layer interposed between the distributed Bragg reflector and the substrate 21, and may also further include a protective layer covering the distributed Bragg reflector. The interface layer may be formed of, for example, $SiO_2$, and the protective layer may be formed of $SiO_2$ or $SiN_X$.

Since the distribution Bragg reflector of the second insulating reflection layer 41 is similar to that of the first insulating reflection layer 37, detailed descriptions thereof will be omitted. However, locations of the long wavelength DBR and the short wavelength DBR in the distributed Bragg reflector of the first insulating reflection layer 37 and locations of the long wavelength DBR and the short wavelength DBR in the distributed Bragg reflector of the second insulating reflection layer 41 are closely related to each other, which are arranged so as to be mirror-faced to each other with the substrate 21 therebetween.

Figure 4A:
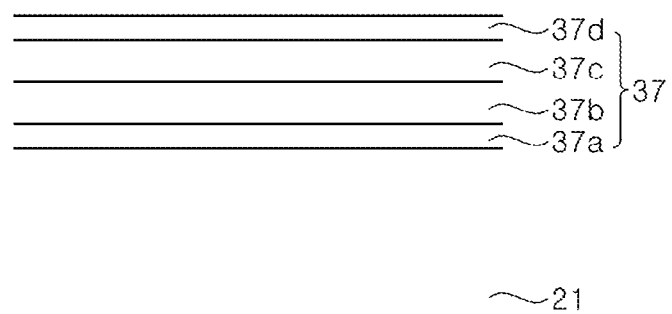
FIGS. 4A and 4B are schematic cross-sectional views illustrating a relative locational relationship between a first insulating reflection layer and a second insulating reflection layer according to the embodiments of the present disclosure.
Figure 4B:
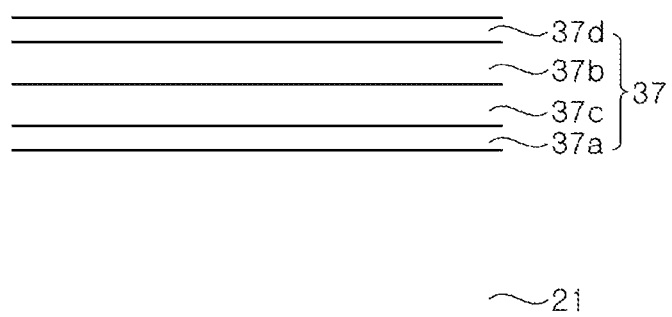
Figure 4B:
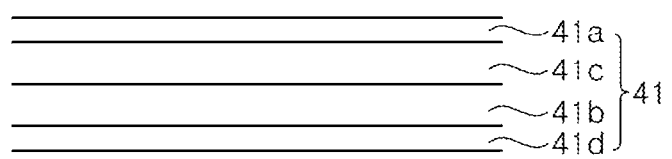

FIGS. 4A and 4B are schematic cross-sectional views illustrating a relative locational relationship between the first insulating reflection layer 37 and the second insulating reflection layer 41 according to the embodiments of the present disclosure.

Referring to FIGS. 4A and 4B, the first insulating reflection layer 37 and the second insulating reflection layer 41 may include interface layers 37a and 41a, long wavelength DBRs 37b and 41b, short wavelength DBRs 37c and 41c and protective layers 37d and 41d, respectively. The long wavelength DBRs 37b and 41b may be formed as the first region described above, and the short wavelength DBRs 37c and 41c may be formed as the second region described above. Although not shown, a third region may be interposed between the first region and the second region.

In the embodiment of FIG. 4A, the long wavelength DBRs 37b and 41b of the first and second insulating reflection layers 37 and 41 are disposed closer to the substrate 21 than the short wavelength DBRs 37c and 41c. On the contrary, in the embodiment of FIG. 4B, the short wavelength DBRs 37c and 41c of the first and second insulating reflection layers 37 and 41 are disposed closer to the substrate 21 than the long wavelength DBRs 37b and 41b.

As shown in FIGS. 4A and 4B, since the long wavelength DBR 37b and the short wavelength DBR 37c of the first insulating reflection layer 37 and the long wavelength DBR 41b and the short wavelength DBR 41c of the second insulating reflection layer 41 are disposed so as to be symmetrical with respect to each other with the substrate 21 interposed therebetween, the light extraction efficiency through the side surfaces of the substrate 21 may be improved.

Meanwhile, the second insulating reflection layer 41 may be formed on the lower surface of the substrate 21 after the first and second pad electrodes 39a and 39b are formed. Next, the second insulating reflection layer 41, the substrate 21 and the first insulating reflection layer 37 are divided through a dicing process, and the flip chip type light emitting diode chip is provided. The second insulating reflection layer 41 reflects light emitted through the lower surface of the substrate 21, and thus helps light extraction in the lateral direction of the substrate 21. Accordingly, a viewing angle of the light emitting diode chip increases.

Figure 5A:
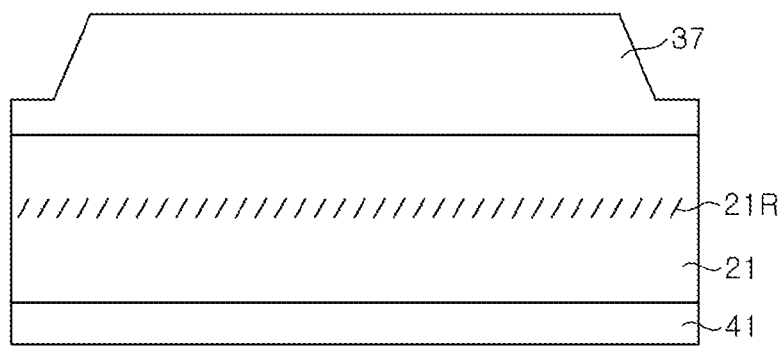
FIGS. 5A and 5B are schematic side views illustrating an inclination of a side surface of the substrate.
Figure 5B:
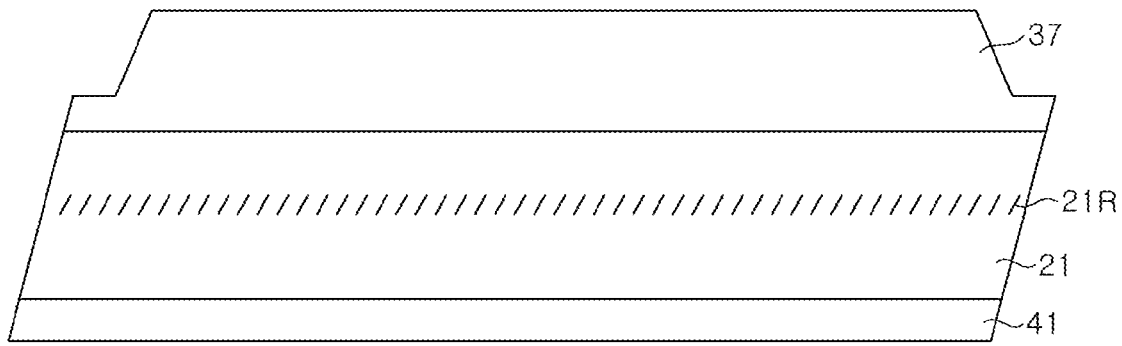

Meanwhile, the substrate 21 of the flip chip type light emitting diode chip has a rectangular shape in plan view, and some of the side surfaces thereof may be inclined with respect to the lower surface of the substrate. FIGS. 5A and 5B are schematic side views illustrating an inclination of the substrate, FIG. 5A is the side view showing a short side surface, and FIG. 5B is the side view showing a long side surface.

Referring to FIG. 5A, both edges of the short side surface parallel to the short side of the substrate 21 are perpendicular to the lower surface of the substrate 21. That is, the long side surfaces of the substrate 21 are perpendicular to the lower surface of the substrate 21. Referring to FIG. 5B, both edges of the long side surface parallel to the long side of the substrate 21 are inclined with respect to the lower surface of the substrate 21. That is, the short side surfaces of the substrate 21 are not perpendicular, but inclined to the lower surface of the substrate 21. In another embodiment, the long side surfaces may be inclined with respect to the lower surface of the substrate 21, and the short side surfaces may be perpendicular to the lower surface of the substrate 21.

Figure 6A:
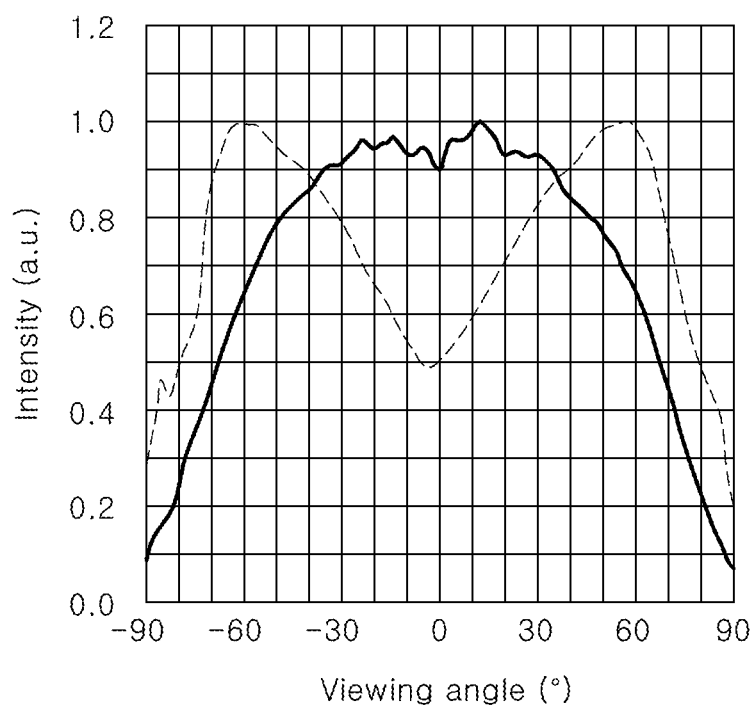
FIGS. 6A and 6B are graphs showing viewing angles in a major axis direction (X axis) and in a minor axis direction (Y axis) depending on whether the second insulating reflection layer is used or not.
Figure 6B:
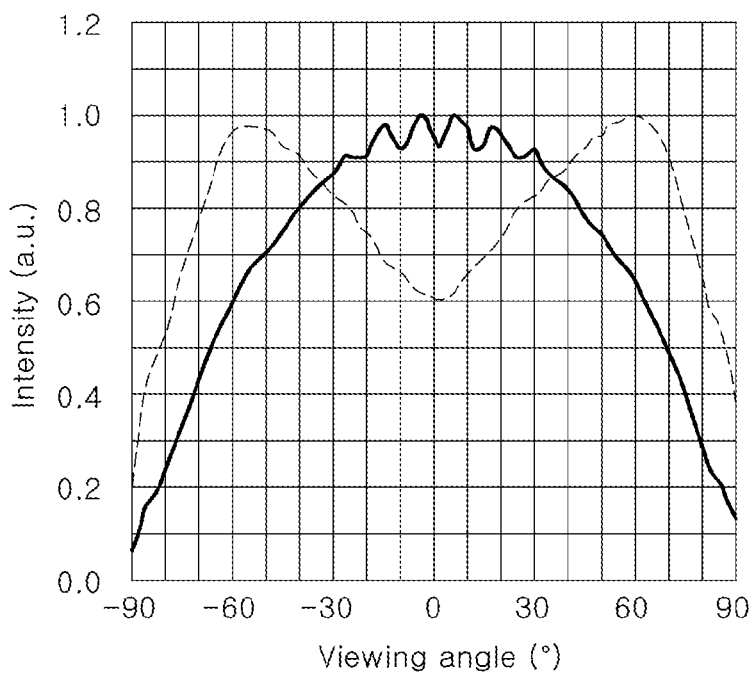

FIG. 6A is a graph showing viewing angles in the major axis direction (X axis) and FIG. 6B is a graph showing viewing angles in the minor axis direction (Y axis) depending on whether the second insulating reflection layer 41 is used or not. An intensity of light was measured in a far field, which was standardized and graphed. In each of the graphs, a solid line represents an intensity of the flip chip type light emitting diode chip of FIG. 1 without the second insulating reflection layer 41, and a dotted line represents an intensity of the flip chip type light emitting diode chip of FIG. 1 with the second insulating reflection layer 41. In each light emitting diode chip, a length of the substrate in the major axis direction is 300 μm, a length of the substrate in the minor axis direction is 220 μm, and widths W1 and W2 of the upper surface of the substrate exposed around the light emitting structure 30 are equal to 15 μm.

Referring to FIGS. 6A and 6B, when the second insulating reflection layer 41 was used, light decreased near zero degrees which is perpendicular to the substrate 21, and increased at −90 degrees and 90 degrees. When the second insulating reflection layer 41 was not used, the viewing angle was about 136 degrees in the X axis direction and 136.3 degrees in the Y axis direction. That is, even when the substrate 21 and the light emitting structure 30 have the rectangular shape, there is no substantial difference in the viewing angles when the second insulating reflection layer 41 is not included.

On the contrary, when the second insulating reflection layer 41 is used, it can be confirmed that the viewing angle in the X axis direction is 160 degrees and the viewing angle in the Y axis direction is 169.4 degrees. That is, the difference in the viewing angles becomes larger by 5 degrees or more.

According to the present embodiment, in a structure where the first insulating reflection layer 37 and the second insulating reflection layer 41 are disposed on both sides of the substrate 21, light generated in the active layer 25 is emitted to the outside through the side surfaces of the substrate 21. Accordingly, the light emitting diode chip may spread light in a wide area, and thus a diffusion plate, a filter, or the like used for preventing a spot phenomenon and the like may be omitted.

According to the present embodiment, in a structure where the contact electrode 33 is separated from the first pad electrode 39a, restrictions on the material layers of the first pad electrode 39a are alleviated. That is, since the first pad electrode 39a does not need to directly form an ohmic contact with the first conductivity type semiconductor layer 23, and also the contact electrode 33 includes an Au layer, occurrence of device defects due to a metal diffusion may be prevented.

Furthermore, in a structure where the current spreader 35 is included, the first insulating reflection layer 37 covers most of the transparent electrode 31 and loss of light absorption due to the metal layer may be reduced while improving the current spreading performance. Even when a reflective layer is formed of a metal layer, a reflectivity of the metal reflection layer is lower than that of the distributed Bragg reflector, and the reflectivity of the metal reflection layer also decreases as the light emitting diode chip is used in an extended period of time. To overcome this problem, in the present embodiment, the distributed Bragg reflector of the first insulating reflection layer 37 is in contact with the transparent electrode 31 to reflect light, and a high reflectivity may be maintained.

In addition, in a structure where the substrate 21 and the light emitting structure 30 are formed in the rectangular shape having the major axis and the minor axis, and the second insulating reflection layer 41 is used, the viewing angle of the substrate 21 depending on the directions thereof may be modified.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangement

What is claimed is:

1. A flip chip type light emitting diode chip comprising:
a substrate;
a first conductivity type semiconductor layer disposed on the substrate;
a mesa disposed on a partial region of the first conductivity type semiconductor layer, and including an active layer and a second conductivity type semiconductor layer;
a transparent electrode being in ohmic contact with the second conductivity type semiconductor layer;
a contact electrode laterally spaced apart from the mesa in a first direction and disposed on the first conductivity type semiconductor layer, the contact electrode being in ohmic contact with the first conductivity type semiconductor layer;
a current spreader disposed on a partial region of the transparent electrode and electrically connected to the transparent electrode;
a first insulating reflection layer covering the substrate, the first conductivity type semiconductor layer, the mesa, the transparent electrode, the contact electrode and the current spreader, having openings exposing portions of the contact electrode and the current spreader, and including a distributed Bragg reflector (DBR);
a first pad electrode and a second pad electrode disposed on the first insulating reflection layer, and connected to the contact electrode and the current spreader through the openings, respectively; and
a second insulating reflection layer disposed under the substrate, and including the distributed Bragg reflector (DBR),
wherein the second insulating reflection layer is spaced apart from the first insulating reflection layer in a second direction which is perpendicular to the first direction.

2. The flip chip type light emitting diode chip of claim 1, wherein the contact electrode and the current spreader have the same layer structure.

3. The flip chip type light emitting diode chip of claim 2, wherein the current spreader includes a connection pad and an extension extending from the connection pad,
wherein the opening of the first insulating reflection layer is located on the connection pad, and
wherein the second pad electrode is connected to the connection pad through the opening.

4. The flip chip type light emitting diode chip of claim 3, wherein the current spreader has an area smaller than, or equal to 1/10 of an area of the transparent electrode.

5. The flip chip type light emitting diode chip of claim 2, wherein thicknesses of the contact electrode and the current spreader in the second direction are greater than that of the mesa.

6. The flip chip type light emitting diode chip of claim 2, wherein the contact electrode and the current spreader include an ohmic metal layer for forming an ohmic contact with the first conductivity type semiconductor layer.

7. The flip chip type light emitting diode chip of claim 1, wherein a lateral distance between the contact electrode and the mesa in the first direction is greater than a thickness of the first insulating reflection layer in the second direction.

8. The flip chip type light emitting diode chip of claim 1, wherein the first insulating reflection layer and the second insulating reflection layer include a short wavelength DBR and a long wavelength DBR, respectively, and the long wavelength DBR of the first insulating reflection layer and the long wavelength DBR of the second insulating reflection layer are disposed closer to the substrate than the short wavelength DBR of the first insulating reflection layer and the short wavelength DBR of the second insulating reflection layer, respectively.

9. The flip chip type light emitting diode chip of claim 1, wherein the first insulating reflection layer and the second insulating reflection layer include a short wavelength DBR and a long wavelength DBR, respectively, and the short wavelength DBR of the first insulating reflection layer and the short wavelength DBR of the second insulating reflection layer are disposed closer to the substrate than the long wavelength DBR of the first insulating reflection layer and the long wavelength DBR of the second insulating reflection layer, respectively.

10. The flip chip type light emitting diode chip of claim 1,
wherein the substrate has a rectangular shape having a major axis and a minor axis, and
wherein a light emitting structure has a rectangular shape having the major axis and the minor axis on the substrate, the light emitting structure including the mesa.

11. The flip chip type light emitting diode chip of claim 10,
wherein a periphery of an upper surface of the substrate is uncovered by the light emitting structure, and
wherein a total width of the periphery of the upper surface of the substrate uncovered by the light emitting structure along the major axis direction or the minor axis direction is within a range of 1/10 to 1/6 of a length of the substrate in the major axis direction or the minor axis direction.

12. The flip chip type light emitting diode chip of claim 11,
wherein a viewing angle of light measured along the major axis direction and a viewing angle of light measured along the minor axis direction differ by 5 degrees or more.

13. The flip chip type light emitting diode chip of claim 11,
wherein the first insulating reflection layer covers substantially all of the upper surface of the substrate.

14. The flip chip type light emitting diode chip of claim 13,
wherein a side surface of the first insulating reflection layer is in flush with a side surface of the substrate.

15. The flip chip type light emitting diode chip of claim 14,
wherein a side surface of the second insulating reflection layer is in flush with the side surface of the substrate.

16. The flip chip type light emitting diode chip of claim 1,
wherein the substrate includes a roughened surface on the side surface thereof.

17. The flip chip type light emitting diode chip of claim 16,
wherein the roughened surface is formed along a periphery of the substrate.

18. The flip chip type light emitting diode chip of claim 1,
wherein the openings of the first insulating reflection layer are disposed adjacent to the contact electrode and the current spreader, respectively.

19. The flip chip type light emitting diode chip of claim 1,
wherein the substrate is a patterned sapphire substrate.

20. The flip chip type light emitting diode chip of claim 1,
wherein at least one of the side surfaces of the substrate is inclined downwardly with respect to a lower surface of the substrate.

* * * * *